US010388807B2

(12) United States Patent
Mathai et al.

(10) Patent No.: US 10,388,807 B2
(45) Date of Patent: Aug. 20, 2019

(54) MIRRORS INCLUDING REFLECTIVE AND SECOND LAYERS DISPOSED ON PHOTODETECTORS (71) Applicant: HEWLETT PACKARD ENTERPRISE DEVELOPMENT LP, Houston, TX (US)

(72) Inventors: Sagi Varghese Mathai, Sunnyvale, CA (US); Michael Renne Ty Tan, Menlo Park, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/120,510

(22) PCT Filed: Apr. 30, 2014

(86) PCT No.: PCT/US2014/036150
§ 371 (c)(1),
(2) Date: Aug. 19, 2016

(87) PCT Pub. No.: WO2015/167524
PCT Pub. Date: Nov. 5, 2015

(65) Prior Publication Data
US 2017/0018664 A1 Jan. 19, 2017

(51) Int. Cl.
H01L 31/0224 (2006.01)
H01L 31/0232 (2014.01)
H01L 31/18 (2006.01)
(52) U.S. Cl.
CPC ........... H01L 31/02327 (2013.01); H01L 31/022416 (2013.01); H01L 31/18 (2013.01)

(58) Field of Classification Search
CPC ....... H01L 31/022416; H01L 31/02327; H01L 33/58; H01L 33/60; H01L 33/40–465; H01L 31/0224; H01L 31/022408; H01L 33/10; H01L 33/36; H01L 33/38; H01L 33/387; H01L 33/405; H01L 33/46
(Continued)

(56) References Cited

U.S. PATENT DOCUMENTS 5,671,914 A    9/1997  Kalkhoran et al.
5,712,504 A *  1/1998  Yano ................... H01L 27/1443
                                                      257/452
(Continued)

FOREIGN PATENT DOCUMENTS

WO   WO-2012034178 A1   3/2012

OTHER PUBLICATIONS

Written Opinion of the International Searching Authority, dated Jan. 2015.*

(Continued)

Primary Examiner — Zandra V Smith
Assistant Examiner — Molly K Reida
(74) Attorney, Agent, or Firm — Tong, Rea, Bentley & Kim, LLC (57) ABSTRACT An example device in accordance with an aspect of the present disclosure includes a photodetector disposed on a substrate, and a mirror disposed on the photodetector. The mirror is to reflect light back into the photodetector. The mirror includes a reflective layer and a second layer. The second layer is disposed between the reflective layer and the photodetector.

13 Claims, 5 Drawing Sheets (58) Field of Classification Search
USPC .................. 257/98, 432, 436; 438/29, 31, 32
See application file for complete search history.

(56) References Cited

U.S. PATENT DOCUMENTS

| | | | | |
|---|---|---|---|---|
| 6,055,262 | A * | 4/2000 | Cox | H01L 33/105 |
| | | | | 257/E31.128 |
| 6,228,673 | B1 | 5/2001 | Loo et al. | |
| 8,357,960 | B1 | 1/2013 | Dutta | |
| 8,610,048 | B2 | 12/2013 | Alieu et al. | |
| 2002/0135036 | A1* | 9/2002 | Terano | B82Y 20/00 |
| | | | | 257/458 |
| 2003/0111667 | A1* | 6/2003 | Schubert | H01L 33/14 |
| | | | | 257/98 |
| 2003/0226952 | A1* | 12/2003 | Clark | H01L 31/02027 |
| | | | | 250/214.1 |
| 2009/0218595 | A1 | 9/2009 | Ishimura et al. | |
| 2010/0013040 | A1* | 1/2010 | Okamoto | H01L 31/022408 |
| | | | | 257/432 |
| 2011/0205551 | A1 | 8/2011 | Saito et al. | |
| 2012/0319223 | A1* | 12/2012 | Weiser | B82Y 20/00 |
| | | | | 257/432 |
| 2013/0193546 | A1 | 8/2013 | Webster et al. | |
| 2013/0207160 | A1 | 8/2013 | Sasahata et al. | |
| 2013/0248821 | A1 | 9/2013 | Miura et al. | |

OTHER PUBLICATIONS

PCT International Search Report dated Mar. 7, 2016, PCT/US2014/036150, 12 pps.
Salvador, A., et al., Resonant cavity enhanced InP/InGaAs photodiode on Si using epitaxial liftoff, Oct. 1994.

* cited by examiner

MIRRORS INCLUDING REFLECTIVE AND SECOND LAYERS DISPOSED ON PHOTODETECTORS

BACKGROUND

Photodetectors may be associated with a quantum efficiency and a speed. A photogenerated carrier transit time may affect the achievable photodetector speed. Accordingly, a thin absorbing layer may be used to improve the speed. However, a thin absorbing layer in the photodetector may result in low quantum efficiency.

DETAILED DESCRIPTION

Examples provided herein include a double-pass photodetector, based on a high reflectivity mirror including a second layer to reflect unabsorbed photons back into an absorbing layer of the photodetector. Photodetector quantum efficiency is improved, without negatively affecting photodetector speed. An example device may be a flip chip, substrate-entry, double-pass photodetector using a dielectric-enhanced high-reflectivity mirror. Thus, example devices are easy to fabricate (low cost), polarization insensitive, have a wide optical bandwidth, enable substrate entry of light input, are easily tested at the wafer level (low cost), and are compatible with flip-chip reflowing.

Figure 1:
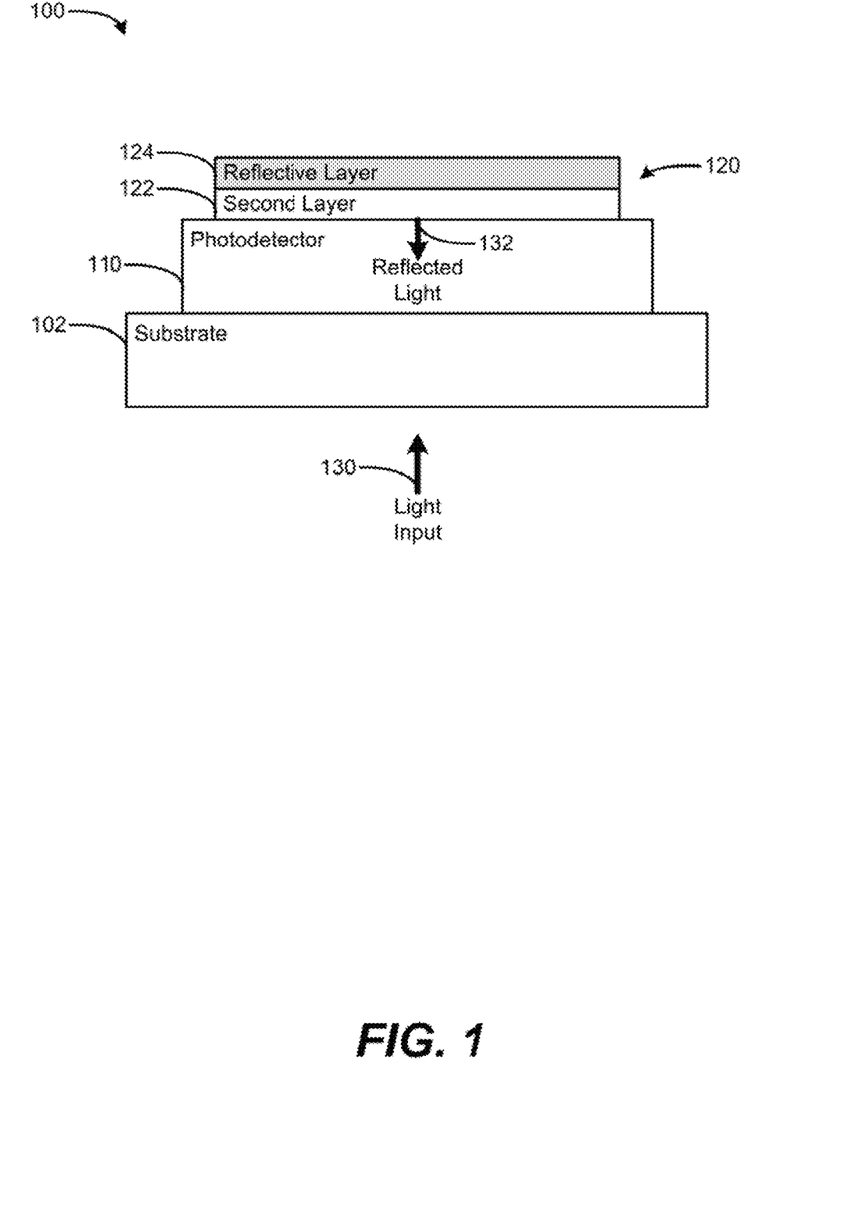
FIG. 1 is a side view block diagram of a device including a photodetector and mirror according to an example.

FIG. 1 is a side view block diagram of a device 100 including a photodetector 110 and mirror 120 according to an example. The photodetector 110 is disposed on substrate 102. The mirror 120 is disposed on the photodetector 110. The mirror includes reflective layer 124 and second layer 122. Light input 130 may pass through the substrate 102. The mirror 120 enables unabsorbed light from the light input 130 to be reflected back into the photodetector 110 as reflected light 132.

Light input 130 may enter through the transparent substrate 102. Device 100 may be a surface-normal illuminated photodetector, where light input 130 may be perpendicular to a surface of the substrate 102. However, the mirror 120 enables other angles (e.g., non-perpendicular) of incident light, and is not limited to perpendicular illumination. Light input 130 may be at an angle, and reflectivity of the mirror 120 may be substantially independent of the incident angle of the light input 130, enhancing the reflectivity of the mirror 120 in view of incident angle and resonance effects that may depend on characteristics of the second layer 122 and the reflective layer 124. The substrate may be a transparent material such as semi-insulating indium phosphide (SI-InP), enabling the light input 130 to proceed to the photodetector 110. At least a portion of the light input 130 is absorbed in the photodetector 110, and unabsorbed light is reflected by the mirror for another pass through the photodetector 110. Accordingly, device 100 may provide a substrate-entry, double-pass photodetector arrangement.

The photodetector 110 may be a p-type-doped, intrinsic, n-type-doped (PIN) photodiode. In an example, the photodetector 110 may include a p-type doped (p+) indium gallium arsenide (InGaAs) upper layer, an intrinsic InGaAs absorbing layer, and an n-type doped (n+) indium phosphide (InP) lower layer. The photodetector 110 also may include contacts (not specifically shown in FIG. 1) for electrical interaction with the photodetector 110, such as ohmic contacts. The photodetector 110 contact layers may be p+In-GaAs and n+ InP, and the contacts may be formed as ring contacts on at least a portion of the photodetector 110.

The mirror 120 includes a second layer 122 and a reflective layer 124. The second layer 122 is disposed between the reflective layer 124 and the photodetector 110. The reflective layer 124 may be a metal. Although a metal may have inherent optical losses associated with light reflecting off the metal, the second layer 122 may be used to enhance the overall reflectivity of the mirror 120, even for metals having a low inherent reflectivity. The second layer 122 can enable resonance of light, such that a resonant effect can improve reflectivity of the mirror 120 in view of angle of incidence of the light input 130 and characteristics of the mirror 120. The second layer 122 also may prevent diffusion of metals into underlying semiconductor layers (e.g., a III-V material) of the photodetector 110, thereby preventing formation of metal spikes, voids, surface roughness, and other significant degradation of materials of the photodetector 110 and reflectivity of the mirror 120. The second layer 122 may prevent such negative interactions between a metal reflective layer 124 and the photodetector 110, while enhancing the reflectivity of the mirror 120.

The second layer 122 may be formed of various materials, including a dielectric, a transparent conductive oxide (e.g., a transparent electrode), etc. A dielectric second layer 122 may have a relatively low index of refraction, on the order of approximately 1.4-2. A transparent electrode second layer 122 may have a similar index of refraction of approximately 2. Thus, the second layer 122 may provide the mirror 120 with desired reflectivity enhancement qualities when paired with the reflective layer 124. Furthermore, the refractive index of the second layer 122 may be relatively lower than an adjacent underlying upper layer of the photodetector 110. For example, a p+ upper layer of the photodetector 110 may have a refractive index of approximately 3.5. Accordingly, the difference between refractive indices of the second layer 122 and the upper layer of the photodetector 110 further enhances reflectivity of the mirror 120.

In an example, the mirror 120 may include a highly reflective metal such as gold as the reflective layer 124, and a second layer 122 (e.g., a dielectric layer of SiO2) formed underneath the reflective layer 124. The example SiO2 dielectric second layer 122 can prevent the gold from diffusing into the semiconductor of the photodetector 110, and enhance the reflectivity of the gold reflective layer 124. The reflective layer 124 is not limited to gold, and may use other metals (e.g. silver (Ag), aluminum (Al), copper (Cu), etc.), including those having inherently poor reflectivity, due to the reflectivity enhancement provided by the second layer 122. The reflective layer 124 is not limited to a single metal layer, and may be multiple metal layers (e.g. titanium/gold, chrome/gold, titanium/platinum/gold, etc.). The mirror 120 is compatible with broad angles of incidence of the light input 130 (e.g., ±20 degrees, depending on the optical thickness of the second layer 122 and the properties of the reflective 124), and the device 100 is insensitive to angular alignment and/or misalignment of light input 130. Although not specifically shown in FIG. 1, a metal reflective layer 124 may be in electrical contact with the semiconductor of the photodetector 110, e.g., based on ohmic or schottky contacts (not shown in FIG. 1) at a periphery of the photodetector 110. The reflective layer 124 may be formed of other materials, including non-metal materials.

The reflective layer 124 may be formed as a high-contrast grating. For example, a high-index material such as amorphous silicon may be deposited on top of the second layer 122, and may be patterned into a sub-wavelength grating (where the dimension of the grating is less than a wavelength of the light to be absorbed by the photodetector 110). The patterning and other grating parameters of the high-contrast grating reflective layer 124 may be chosen accordingly, to act as a very high reflectivity material in conjunction with the second layer 122. The reflective layer 124, including those formed of high contrast gratings (or metals etc.), may be formed in various patterns across the device 100, such as fingered extensions, dots, circles, meshes, holes, and so on.

The reflective layer 124 also may be a formed by a multi-layer dielectric, including at least one high-index dielectric layer and at least one low-index dielectric layer. Thus, the mirror 120 may be generalized as a multi-layer dielectric, including a dielectric second layer 122 disposed on the photodetector 110. In an example, a multi-layer dielectric may be formed of a plurality of layers having approximately a quarter-wavelength thickness per layer. Thus, the reflective layer 124 also may include a distributed Bragg reflector (DBR), such as a hybrid of a DBR layer with a metal layer to form the reflective layer 124, and/or a hybrid of a DBR layer with a high-contrast grating to form the reflective layer 124.

The second layer 122 of the mirror 120 may be formed of various materials, including oxides, nitrides, and the like. Second layer 122 may be formed with a thickness to enhance reflectivity of the reflective layer 124, and prevent diffusion between the reflective layer 124 and the photodetector 110. The thickness of the second layer 122 may be approximately/substantially a quarter wavelength of the light input 130. In an example, a SiO2 dielectric second layer 122 may have a thickness of approximately 0.8 to 1.1 of a quarter wavelength, between the photodetector 110 and a reflective layer 124 made of titanium metal. Such an example can provide a reflectance of the mirror 120 of approximately 70%, across a range of wavelengths (e.g., 900 nanometers (nm) to 1100 nm). Accordingly, mirror 120 including second layer 122 provides a much higher reflectance than titanium metal alone, which is approximately 20%.

The mirror 120 enables device 100 to have a simplicity of structure, based on two layers (second layer 122 and reflective layer 124). Furthermore, the mirror 120 enables additional benefits such as polarization insensitivity and a wide optical bandwidth (e.g., based on the use of a metal reflective layer 124).

The second layer 122 is not limited to a single layer, and may include multiple layers, including dielectrics and/or transparent conductive oxides. In an example, a multi-layer second layer 122 may form a low-reflectivity DBR. A metal reflective layer 124 may be formed on top of the DBR to form a high-reflectivity mirror 120, based on the enhancement afforded by the layers underlying the metal reflective layer 124. Accordingly, the mirror 120 may be a hybrid that includes a metal layer as well as multiple underlying layers, which could be a DBR, a single-layer of oxide, a transparent conductive oxide, or other various combinations of such layers. The DBR second layer 122 may be formed from semiconductor materials.

Figure 2:
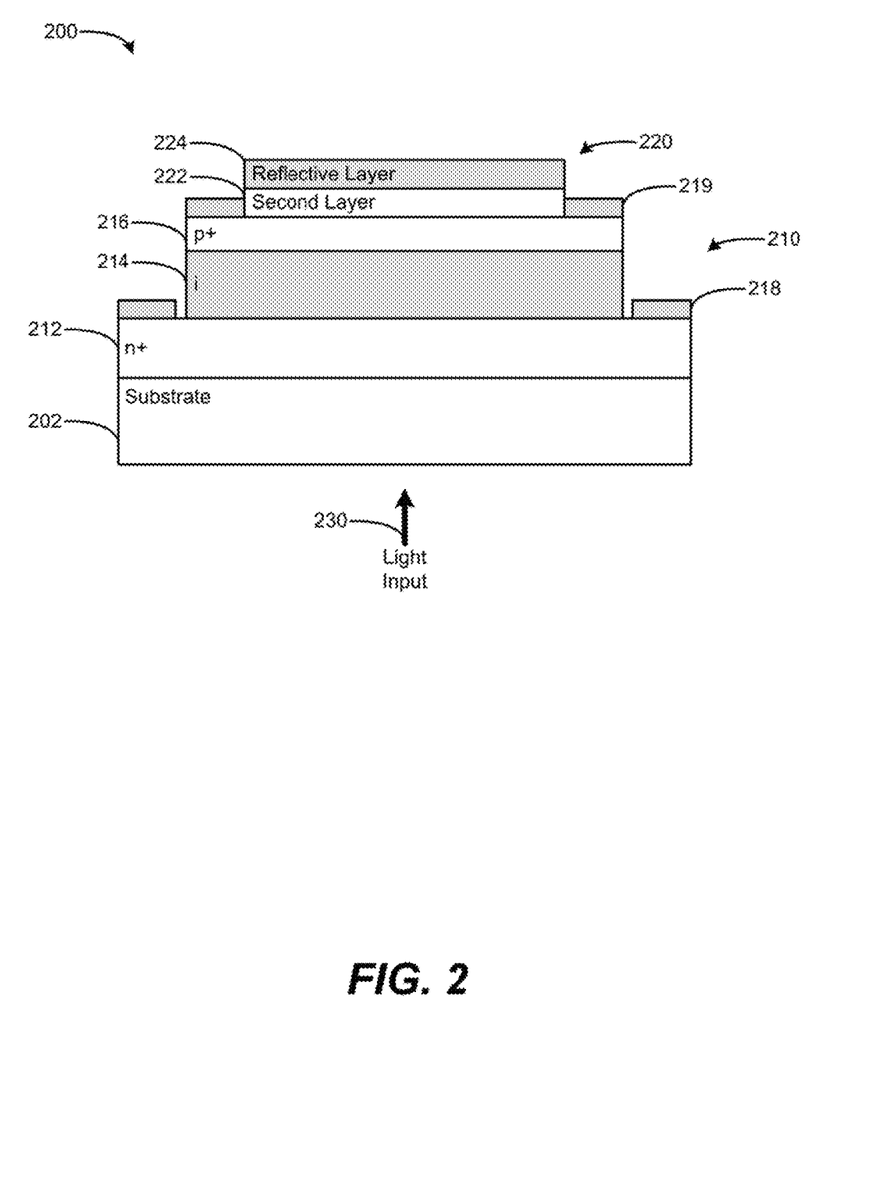
FIG. 2 is a side view block diagram of a device including a photodetector and mirror according to an example.

FIG. 2 is a side view block diagram of a device 200 including a photodetector 210 and mirror 220 according to an example. The photodetector 210 is disposed on substrate 202, and includes lower layer 212, first contacts 218, absorbing layer 214, upper layer 216, and second contacts 219. The mirror 220 is disposed on the photodetector 210, and includes reflective layer 224 and second layer 222. Light input 230 may enter the substrate 202 toward the photodetector 210 and mirror 220. In other examples, the substrate 202 may be removed such that the light input 230 enters the lower layer 212 without entering the substrate 202.

A mesa structure is formed to define the photodetector 210, and provide access to the lower layer 212 (e.g., n+ InP) of the photodetector 210 to form the first contact 218. In an example, an ohmic contact may be used as the first contact 218 and/or the second contact 219, and may be formed in a ring or other geometry. The second contact 219 may be formed on the upper layer 216 (e.g., p+ InGaAs) of the photodetector 210. The second contact 219 (e.g., an ohmic ring contact) may work in conjunction with a heavily doped upper layer 216 (e.g., p+ InGaAs), to provide a uniform electric field across the absorbing layer 214 for efficiently absorbing the light input 230.

Thus, the photodetector 210 has a PIN structure, and a voltage may be applied to the PIN structure (e.g., via first contacts 218 and second contacts 219) to create an electric field inside the absorbing layer 214. Accordingly, the P, I, and N layers (upper layer 216, absorbing layer 214, and lower layer 212) may behave as a capacitor having a voltage that provides an electric field that sweeps out photogenerated carriers in the absorbing layer 214. The photogenerated carriers are swept out to the lower layer 212 and the upper layer 216 to enable the device 200 to extract out current that is being generated by the light input 230.

An electric field may be generated uniformly across the absorbing layer 214 based in part on the heavily doped p+ upper layer 216, e.g., InGaAs, and the arrangements of the electrodes 218, 219. Thus, the heavily doped semiconductor upper layer 216 may behave as a type of extension of the metal ohmic contacts. Thus, the upper layer 216 can prevent the generated electric field from primarily dropping below the ohmic first contacts 219, ensuring uniformity at the absorbing layer 214. The uniform electric field across the absorbing layer 214 enables the electrons and holes, generated by the light input 230, to be swept out by the electric field across the cross-sectional area of the absorbing layer 214. The device 200 thereby avoids low electric field regions in the absorbing layer 214, efficiently accelerating the generated electrons and holes to their saturation velocity for quickly and efficiently sweeping out the carriers and providing device 200 with a fast response time. Additionally, the uniform electric field enables the use of a lower external voltage bias needed across the photodetector 210. The upper layer 216 can be a wide-bandgap material, to cause a substantially large proportion of the light input 230 to be absorbed in the absorbing layer 214. Additionally, a low bandgap material may be located below electrodes 218, 219 to form a low resistance ohmic contact. A thickness of the lower and upper layers 212, 216 may be chosen to be sufficiently thick to avoid a variation in voltage across the device 200 (e.g., from one end of the ring shape to the other), ensuring that the voltage across the lower layer 212 and upper layer 216 is uniform.

In an example, the second contact 219 may be formed as a ring contact surrounding the mirror 220. For example, the mirror 220 may be formed in an aperture of the second contact 219 on top of the mesa structure of the photodetector 210. The mirror 220 may include a SiO2 dielectric film as the second layer 222, deposited along with a metal as the reflective layer 224. The second layer 222 can prevent metal diffusion into the semiconductor of the photodetector 210, and enhance the reflectivity of the metal reflective layer 224. The upper layer 216 (p+ layer) may be highly doped, to be high in conductivity such that a voltage across the upper layer 216 is substantially uniform to enhance efficiency of the photodetector 210.

The reflective layer 224 may be a metal layer that may be formed as a part of the formation of the second contact 219. In an example, the reflective layer 224 and the second contact 219 may be formed by covering the photodetector mesa top surface with a metal layer, allowing metal to be deposited as the reflective layer 224 and the ohmic contacts for the second contacts 219. A discontinuity and/or break is shown between the reflective layer 224 and the second contact 219, due to the geometric profile/difference in height caused by the presence of the second layer 222 on top of a portion of the upper layer 216 of the photodetector 210. In an alternate example, the reflective layer 224 and the second contacts 219 may be connected to each other and/or maintain electrical continuity. Additionally, the second contacts 219 may be spaced from the second layer 222 and/or reflective layer 224 (but are shown in contact with the second layer 222). In an alternate example, the second layer 222 of the mirror 220 may be formed as a transparent electrode. Accordingly, the transparent electrode second layer 222 and the second contacts 219 may be formed together as a continuous film on top of the upper layer 216, thereby reducing a number of needed fabrication steps. Furthermore, the use of a continuous structure for second layer 222/second contacts 219 enables the reflective layer 224 also to be formed across the entire width of the upper layer 216, enabling a relatively wider mirror 220 to be used for covering across the photodetector 210.

The reflective layer 224 and the second contact 219 may be deposited as a metal in the same step. In an example, additional and/or different amounts of dopant may be added during metal deposition, including deposition of the metal reflective layer 224, second contacts 219, and/or first contacts 218 (which may be deposited separately from the second contacts 219). Accordingly, the first contacts 218 may be compatible with n+ doping of the lower layer 212, and the second contacts 219 may be compatible with the p+ doping of the upper layer 216. Metal deposition may be used to affect doping of these and other underlying layers of the device 200. The first contacts 218 and second contacts 219 may be formed laterally in contact with their corresponding adjacent structure (e.g., as with second contact 219 and the mirror 220), and/or may be formed laterally spaced from their corresponding adjacent structure (e.g., as with the first contact 218 and the photodetector 210). The first contacts 218 may be arranged to avoid interfering with light entering the absorbing layer 214 of the photodetector 210, while still being close to the mesa structure to reduce series resistance with the photodetector structure.

In an alternate example, the device 200 may include a supplemental layer (not shown), disposed between the upper layer 218 of the photodetector 210, and the second layer 222 of the mirror 220. In an example, the supplemental layer may be conductive according to the type of doping (e.g., p+) as the upper layer 216 of the photodetector 210. In other examples, the supplemental layer may be a transparent conductor (e.g. indium tin oxide or similar material) with thickness designed to enhance the reflectivity of the reflector layer 224.

The example device 200 includes a layout of the mesa structure and placement of the contacts 218, 219. Accordingly, the device 200 may be fabricated using a small number of fabrication steps, and the contacts 218, 219 are arranged and connected to metal pads for compatibility with flip-chip device mounting. For example, the device 200 may be flip-chip mounted onto a printed circuit board (PCB), where the mounted device 200 has been flipped upside-down to where the substrate 202 faces away from the mounting PCB, allowing light input 230 to enter through the substrate 202. The first contacts 218 and the second contacts 219 may thereby face toward the PCB, for directly soldering (the device 200 may be provided with solder bumps for reflowing with the PCB, or the PCB may be provided with the solder bumps) without a need for wire bonding. Furthermore, the mesa structure of device 200 enables efficient testing at a wafer level, due to the first electrodes 218 and the second electrodes 219 being exposed on the wafer without a need to dice the wafer into individual devices 200 or add wire bonding.

Use of mirror 220 enables efficiency enhancements of device 200 over a wide optical bandwidth (e.g., 900 nm-1100 nm), unlike photodetectors based on a resonant cavity whose quantum efficiency is associated with a narrow optical bandwidth. Furthermore, mirror 220 may be formed by two layers (reflective layer 224 and second layer 222), unlike resonant cavity photodetectors based on many layers that are needed to be grown on a device using a time-consuming technique.

Figure 3:
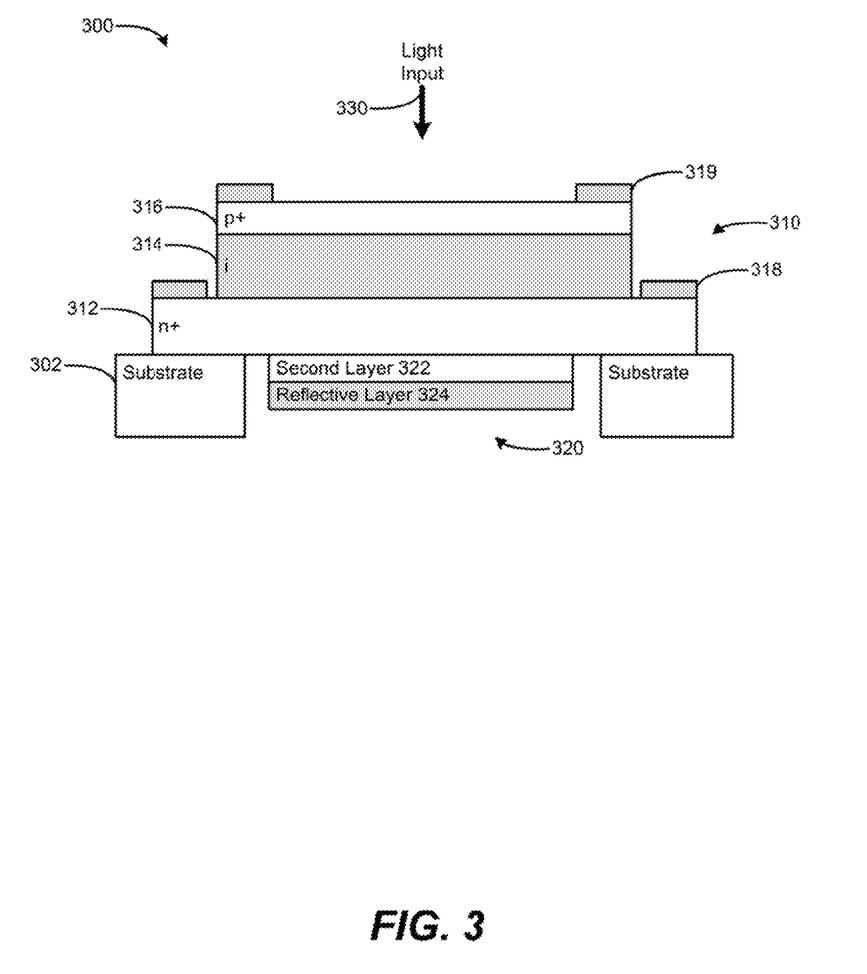
FIG. 3 is a side view block diagram of a device including a photodetector and mirror according to an example.

FIG. 3 is a side view block diagram of a device 300 including a photodetector 310 and mirror 320 according to an example. The photodetector 310 is disposed on substrate 302, and includes lower layer 312, first contacts 318, absorbing layer 314, upper layer 316, and second contacts 319. The mirror 320 is disposed on the photodetector 310, and includes reflective layer 324 and second layer 322. Light input 330 may enter the photodetector 310 toward the mirror 320, without needing to pass through the substrate 302.

The photodetector 310 may be formed on top of the substrate 302, and at least a portion of the substrate 302 may be partially removed (e.g., etched away) in a vicinity beneath the mesa structure of the photodetector 310. In the example of FIG. 3, the entire structure of the substrate 302 has been removed. In alternate examples, a portion (e.g., a layer) of the substrate 302 may remain, e.g., separating the mirror 320 from the photodetector 310. Additionally, the substrate 302 is shown removed to the extent of providing spacing to either side of the mirror 320. In an alternate example, the substrate 302 may be in contact with the mirror 320, either by decreasing a width of the cavity in the substrate 302, or by increasing a width of the mirror 320. Additionally, at least a portion of the lower layer 312 of the photodetector also may be etched away, for placing the second layer 322 and reflective layer 324 of the mirror 320 closer to the absorbing layer 314 of the photodetector. In an alternate embodiment, the substrate 302 may be heavily doped such that the first contacts 318 may be formed on the substrate. Additionally, the reflective layer 324 may be in contact with the substrate and form ohmic contacts with the substrate.

The light input 330 may enter the device 300 from a top side, e.g., from the side of the substrate 302 including the photodetector 310. Accordingly, the substrate 302 does not need to be transparent. Thus, the substrate 302 may be made of additional types of (e.g., non-transparent) materials, including materials that would absorb or reflect wavelength ranges that are to be absorbed by the photodetector 310 (e.g., wavelengths of approximately 800 nm associated with GaAs, used with a substrate 302 that absorbs wavelengths of approximately 850 nm).

Figure 4A:
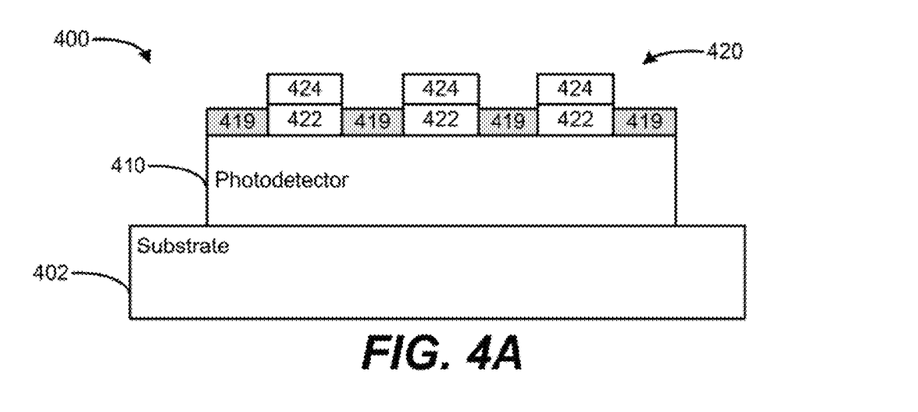
FIG. 4A is a side view block diagram of a device including a photodetector and mirror according to an example.

FIG. 4A is a side view block diagram of a device 400 including a photodetector 410 and mirror 420 according to an example. The photodetector 410 is disposed on substrate 402, and includes contact 419. The mirror 420 is disposed on the photodetector 410. The mirror includes reflective layer 424 and second layer 422, and is disposed on the photodetector 410 between the contact 419.

The contact 419 is provided as multiple segments (e.g., fingers, stripes, mesh, etc.), instead of as a single segment (such as a ring electrode). The contact 419 may be formed as parallel fingers on a top of the photodetector 410. Other shapes are possible for the structure of electrodes, such as a mesh, a honeycomb, concentric circles/squares, or other geometric and/or non-geometric shapes. The mirror 420 may be placed in gaps between the contacts 419. For example, an oxide layer may be set down as the second layer 422, between the contacts 419. The reflective layer 424, such as a mirror/metal coating, may be placed on the second layer 422. Thus, the reflectivity enhancement of the mirror 420, along with the electrode 419, is spread across the photodetector 410. The mirror 420 and electrode/contact 419 may be placed within a form factor/area, providing enhanced reflectivity regardless of any particular geometric limitations in a shape of the photodetector 410. In an example, the mirror 420 may provide a desired percentage of coverage of the photodetector 410, independent of a shape of the photodetector 410 (e.g., a circle, square, or other geometry). The photodetector 410 may be functional based on a ratio of coverage of the mirror 420 and contact 419. For example, FIG. 4A shows the contact portions 419 having a slightly narrower width than the mirror portions 420. In an alternate example, the relative widths of the mirrors 420 and contacts 419 may be varied according to other ratios. The contact portions 419 may be made thinner to avoid light loss, while still being thick enough to be effective connectors to the photodetector 410 structure. The contacts 419 are shown without any additional structuring. However, a high-reflectivity portion (not shown) also may be added to the contacts 419. For example, the contacts 419 may be formed as a semi-transparent metal, transparent conductive oxide, etc., and a reflective layer 424 also may be formed on top of the contacts 419 to increase total reflectivity across the entire photodetector 410.

Figure 4B:
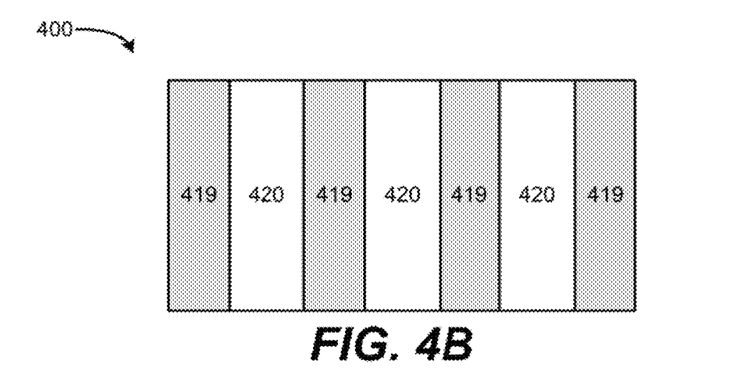
FIG. 4B is a top view block diagram of a device including a mirror and second contact according to an example.

FIG. 4B is a top view block diagram of a device 400 including a mirror 420 and contact 419 according to an example. The contact 419 is a fingered contact. The mirror 420 is disposed between fingers of the fingered contact 419.

The contact 419 and mirror 420 are disposed on a top surface of the mesa structure as fingers across the entire surface, instead of using a ring-shaped electrode on a periphery of the photodetector. In an alternate example, the contact 419 and/or mirror 420 may be disposed on less than the entire surface of the mesa. The contact 419 is shown having multiple fingers to partially cover the mesa, with the mirror 420 filling the gaps between the contact 419. The illustrated dimensions are not limited to those shown, and may vary (e.g., having a narrower contact 419 and wider mirror 420, or other variations including irregular variations, ratios, and/or percentages).

Figure 4C:
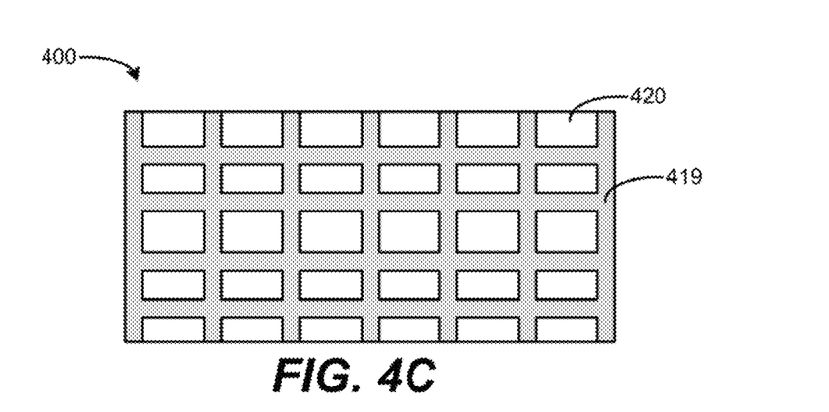
FIG. 4C is a top view block diagram of a device including a mirror and second contact according to an example.

FIG. 4C is a top view block diagram of a device 400 including a mirror 420 and contact 419 according to an example. The contact 419 is a mesh contact. The mirror 420 is disposed at gaps in the mesh contact 419.

The mesh shown in FIG. 4C is based on rectangular/geometric patterns. However, other types of meshes may be used, including those based on circles, triangles, hexagons, other geometric shapes, and irregular/non-geometric shapes. The mesh may describe a ratio of coverage between the contact 419 and the mirror 420, to provide desired optical and electrical characteristics for the underlying photodetector.

Figure 5:
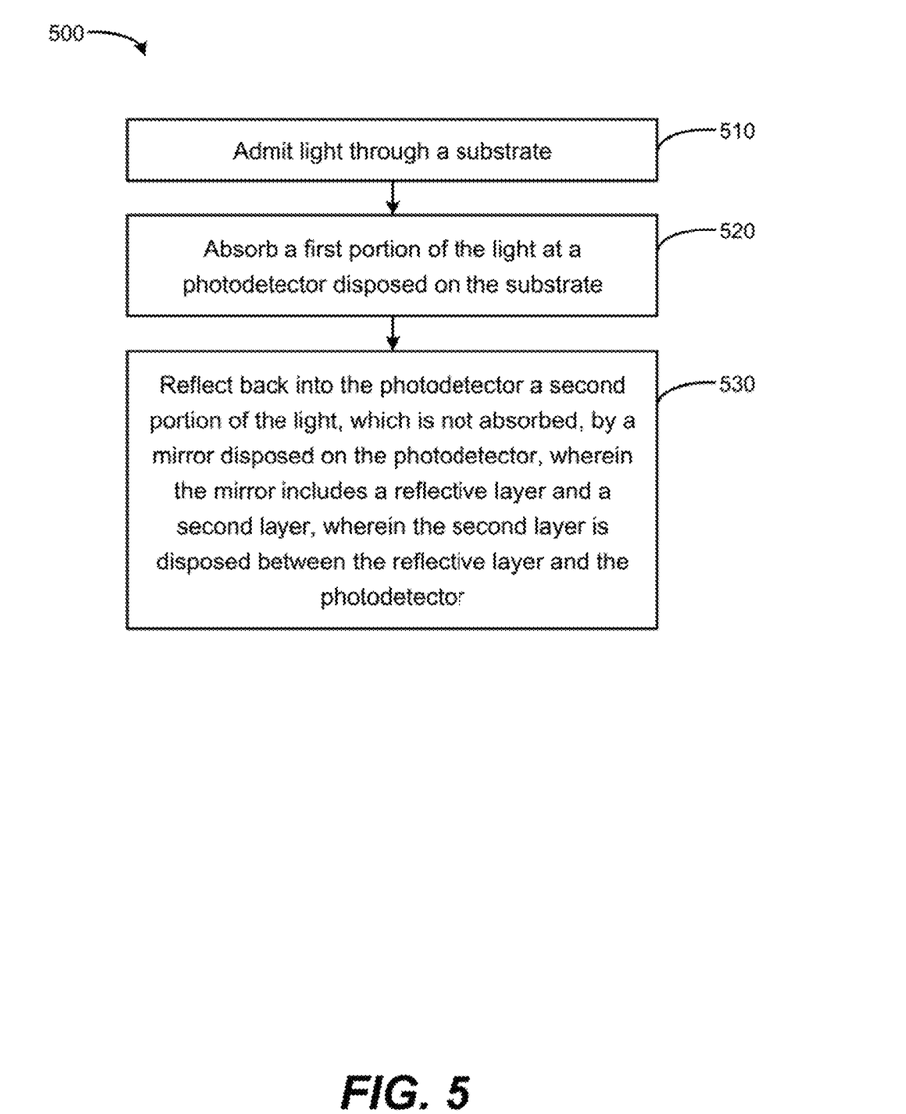
FIG. 5 is a flow chart based on absorbing light at a photodetector according to an example.

Referring to FIG. 5, a flow diagram is illustrated in accordance with various examples of the present disclosure. The flow diagram represents processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 5 is a flow chart 500 based on absorbing light at a photodetector according to an example. In block 510, light is admitted through a substrate. For example, the substrate may be transparent to a range of wavelengths to be absorbed by the photodetector, enabling the structure to be flip-chip surface mounted on a PCB with the substrate away from the PCB toward the light input. In block 520, a first portion of the light is absorbed at a photodetector disposed on the substrate. For example, the photodetector may include an absorbing layer that is made relatively thin to enhance response speed of the photodetector, enabling a portion of the light to be absorbed on the first pass through the photodetector. In block 530, a second portion of the light, which is not absorbed, is reflected back into the photodetector by a mirror disposed on the photodetector. The mirror includes a reflective layer and a second layer, and the second layer is disposed between the reflective layer and the photodetector. For example, the mirror may be based on an oxide dielectric or transparent electrode layer of less than a quarter wavelength, to separate a metal reflective layer from the photodetector and enhance reflectivity of the metal reflective layer.

What is claimed is:

1. A device comprising:
    a substrate;
    a photodetector disposed on the substrate, wherein the photodetector comprises an upper layer that is heavily p+ doped, an absorbing layer, and a lower layer that is heavily n+ doped, wherein the photodetector comprises a mesa structure comprising the absorbing layer and the upper layer, the mesa structure located on the lower layer, and wherein a first ohmic contact comprising a first material and having a circular ring geometry is formed on the lower layer; and
    a mirror disposed on the photodetector to reflect light back into the photodetector, wherein the mirror includes a reflective layer and a second layer disposed between the reflective layer and the photodetector, wherein the reflective layer comprises a second material different from the first material, wherein the reflective layer comprises a distributed Bragg reflector (DBR) and a high contrast grating reflector, wherein the photodetector further comprises a fingered contact as a second ohmic contact having a plurality of fingers and formed on the mesa structure, wherein the mirror is disposed between the plurality of fingers of the fingered contact, wherein the reflective layer covers the second layer and the fingered contacts.

2. The device of claim 1, wherein the mirror is disposed on a surface of the photodetector opposite the substrate.

3. The device of claim 2, wherein the substrate is transparent to allow light that is to be absorbed by the photodetector, to pass through the substrate to reach the photodetector.

4. The device of claim 1, wherein the second layer is a dielectric layer of SiO2.

5. The device of claim 1, wherein a portion of the substrate is removed to expose a corresponding portion of the photodetector, and the mirror is disposed where the portion of the substrate is removed on a surface of the photodetector toward the substrate.

6. The device of claim 1, wherein the second layer of the mirror has a thickness of less than substantially ¼ wavelength of light that is to be absorbed by the photodetector.

7. The device of claim 1, wherein the mesa structure is formed with vertical walls relative to the lower layer.

8. A device comprising:
a substrate;
a photodetector including a lower layer that is heavily n+ doped, an absorbing layer, and an upper layer that is heavily p+ doped, wherein the photodetector has a mesa formation comprising the absorbing layer and the upper layer, the mesa formation located on the lower layer disposed on the substrate and wider than the absorbing layer and the upper layer, wherein a first ohmic contact comprising a first material and having a circular ring geometry is formed on the lower layer; and
a mirror disposed on the photodetector to reflect light back into the absorbing layer of the photodetector, wherein the mirror includes a reflective layer and a second layer disposed between the reflective layer and the upper layer of the photodetector, wherein the reflective layer comprises a second material different from the first material, wherein the reflective layer comprises a distributed Bragg reflector (DBR) and a high contrast grating reflector, wherein the photodetector further comprises a fingered contact as a second ohmic contact having a plurality of fingers and formed on the mesa structure, wherein the mirror is disposed between the plurality of fingers of the fingered contact, wherein the reflective layer covers the second layer and the fingered contacts.

9. The device of claim 8, wherein the photodetector further comprises a ring ohmic contact formed on the lower layer.

10. The device of claim 8, wherein the mesa formation is formed with vertical walls relative to the lower layer.

11. A method, comprising:
admitting light through a substrate;
absorbing a first portion of the light at a photodetector disposed on the substrate; and
reflecting back into the photodetector a second portion of the light, which is not absorbed, by a mirror disposed on the photodetector, wherein the mirror includes a reflective layer of a first material and a second layer, wherein the reflective layer comprises a distributed Bragg reflector (DBR) and a high contrast grating reflector, wherein the photodetector further comprises a fingered contact as a second ohmic contact having a plurality of fingers and formed on the mesa structure, wherein the mirror is disposed between the plurality of fingers of the fingered contact, wherein the reflective layer covers the second layer and the fingered contacts, wherein the second layer is disposed between the reflective layer and the photodetector; and wherein the photodetector comprises an upper layer that is heavily p+ doped, an absorbing layer, and a lower layer that is heavily n+ doped, wherein a first ohmic contact comprising a second material different from the first material is formed on the lower layer and the photodetector comprises a mesa structure located on the lower layer comprising the absorbing layer and the upper layer.

12. The method of claim 11, further comprising generating a substantially uniform electric field across the absorbing layer of the photodetector based on a first ohmic contact having a circular ring geometry and formed on the lower layer and a second ohmic contact formed on the mesa structure.

13. The method of claim 11, further comprising forming the mesa structure to have vertical walls relative to the lower layer.

* * * * *